(12) United States Patent
Boroson et al.

(10) Patent No.: US 6,566,032 B1
(45) Date of Patent: *May 20, 2003

(54) IN-SITU METHOD FOR MAKING OLED DEVICES THAT ARE MOISTURE OR OXYGEN-SENSITIVE

(75) Inventors: Michael L. Boroson, Rochester, NY (US); Myron W. Culver, Rochester, NY (US); Lee W. Tutt, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/141,587

(22) Filed: May 8, 2002

(51) Int. Cl.[7] ............................... G03F 7/37; G03F 7/16
(52) U.S. Cl. ....................... 430/200; 430/201; 430/319; 430/935
(58) Field of Search ................................ 430/200, 201, 430/319, 935

(56) References Cited

U.S. PATENT DOCUMENTS

| | | | |
|---|---|---|---|
| 5,688,551 A | 11/1997 | Littman et al. ............. 430/200 |
| 5,742,129 A | 4/1998 | Nagayama et al. .......... 315/167 |
| 5,756,249 A | * 5/1998 | Ellis ............................ 430/200 |
| 5,851,709 A | 12/1998 | Grande et al. ............... 430/200 |
| 5,904,961 A | * 5/1999 | Tang et al. .................. 430/200 |
| 5,937,272 A | 8/1999 | Tang .......................... 430/200 |
| 6,114,088 A | 9/2000 | Wolk et al. ................. 430/200 |
| 6,140,009 A | 10/2000 | Wolk et al. ................. 430/200 |
| 6,214,520 B1 | 4/2001 | Wolk et al. ................. 430/200 |
| 6,221,553 B1 | 4/2001 | Wolk et al. ................. 430/201 |

* cited by examiner

*Primary Examiner*—Richard L. Schilling
(74) *Attorney, Agent, or Firm*—Raymond L. Owens

(57) ABSTRACT

An in-situ method for fabricating, at least in part, an OLED device that is moisture- or oxygen-sensitive, such method comprising the steps of: providing into a controlled atmosphere coater a receiver element which will form part of the OLED device; providing into the controlled atmosphere coater a donor support element and coating such donor support element to produce a donor element with one or more layers required to produce all or part of the OLED device; controlling the atmosphere in the controlled atmosphere coater under controlled conditions; positioning the coated side of the donor element in material transferring relationship to the receiver element to be coated; and applying radiation to the donor element to selectively transfer one or more layers from the donor element to the receiver element.

16 Claims, 6 Drawing Sheets

IN-SITU METHOD FOR MAKING OLED DEVICES THAT ARE MOISTURE OR OXYGEN-SENSITIVE

CROSS REFERENCE TO RELATED APPLICATIONS

Reference is made to commonly assigned U.S. patent application Ser. No. 10/021,410 filed Dec. 12, 2001, entitled "Apparatus for Permitting Transfer of Organic Material From a Donor to Form a Layer in an OLED Device" by Phillips et al and commonly assigned U.S. patent application Ser. No. 10/033/459 filed Dec. 27, 2001, entitled "In-Situ Vacuum Method for Making OLED Devices" by Boroson et al, the disclosures of which are incorporated herein by reference.

FIELD OF THE INVENTION

The present invention relates to making OLED devices.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electronic transport layer (for electron transport). In forming the RGB pixels in a full-color OLED display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow-mask method is that the mask holes can become plugged over time. Plugged holes on the mask lead to the undesirable result of non-functioning pixels on the EL display.

A suitable method for patterning high-resolution OLED displays has been disclosed in commonly-assigned U.S. Pat. No. 5,851,709 by Grande et al. this method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color-forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This creates many of the same problems as the shadow-mask method, including the requirement for precision mechanical alignment between the donor substrate and the display substrate. A further problem is that the donor pattern is fixed and cannot be changed readily.

Using an unpatterned donor element and a precision light source, such as a laser, can remove some of the difficulties seen with a patterned donor. Littman and Tang (commonly-assigned U.S. Pat. No. 5,688,551) teach the patternwise transfer of organic EL material from an unpatterned donor sheet to an EL substrate. A series of patents by Wolk et al (U.S. Pat. Nos. 6,114,088; 6,140,009; 6,214,520; and 6,221,553) teaches a method that can transfer the luminescent layer of an EL device from a donor element to a substrate by heating selected portions of the donor with a laser beam.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask. The aperture mask can be a separate entity between the donor layer and substrate (as in FIG. 1 in the aforementioned patent), or can be incorporated into the donor layer (as in FIGS. 4, 5, and 6 in the aforementioned patent).

The EL material transfer is preferably done under conditions of reduced oxygen and/or water, using a chamber such as Tang describes in the aforementioned patent. The donor layer (and aperture, if separate) and substrate must be kept in close proximity. As an example, Tang shows an aperture or donor layer held close to or on a passivating layer, such that there is a preferable distance between the donor layer and the intended donor target of the bottom electrode. The use of vacuum or reduced pressure can facilitate the transfer of the EL material from the donor to the substrate. The use of such conditions during transfer is also advantageous in that some EL materials are sensitive to oxygen and/or moisture. For example, aluminum hydroxyquinoline (Alq), which is used in OLED devices, is known to react with water. In addition, the electrode materials used on both small molecule and polymer EL devices are extremely unstable in air. The use of low oxygen and/or water conditions during the transfer step can help reduce the failure rate of OLED devices. Additionally, losses of OLED devices can occur because of degradation of the donor material before transfer to the substrate in the methods taught by Littman, Tang, and Wolk. The donor material is generally transported from its preparation site to the site where it is transferred to the substrate. Contamination of the donor by oxygen, moisture, and/or other atmospheric components is possible during this time. This can lead to reduced yields of OLED displays prepared from the donor.

SUMMARY OF THE INVENTION

It is therefore an object of the present invention to provide a method, which eliminates the need for a shadow mask.

It is a further object of the present invention to provide a method which uses a donor element but eliminates problems associated with providing a donor element at a remote location from where it is to be used and shipping such donor element without causing contamination or damage to the donor element.

It is a further object of the present invention to provide an improved shadow mask free method which effectively can be used to produce full color OLED displays.

This object is achieved by an in-situ method for fabricating, at least in part, an OLED device that is moisture- or oxygen-sensitive, such method comprising the steps of:

a) providing into a controlled atmosphere coater a receiver element which will form part of the OLED device;

b) providing into the controlled atmosphere coater a donor support element and coating such donor support element to produce a donor element with one or more layers required to produce all or part of the OLED device;

c) controlling the atmosphere in the controlled atmosphere coater so that either the water vapor level is less than 1000 ppm but greater 0 ppm or the oxygen level is less than 1000 ppm but greater than 0 ppm, or both the water vapor level and oxygen level are respectively less than 1000 ppm but greater than 0 ppm;

d) positioning the coated side of the donor element in material transferring relationship to the receiver element to be coated; and e) applying radiation to the donor element to selectively transfer one or more layers from the donor element to the receiver element.

An advantage of the method described in this invention is that it is useful in producing OLED devices without introducing moisture, oxygen, or other atmospheric components and without using shadow mask.

In accordance with the present invention, donor element is made with the same controlled-atmosphere coater used for transferring materials from the donor element to the OLED receiver element. This provides a number of advantages including:

it reduces the need for donor storage and transport, and concomitant contamination;

it can reduce or eliminate damage and contamination from the contact of the donor side with the support side of the donor;

it reduces the keeping requirements for the donor; and it can improve the yield of OLED devices.

A further advantage is that this method can be fully automated including donor and substrate media handling. The present invention is particularly suitable for forming organic layers over a large area having a number of OLED display devices, which are in the process of being formed, thereby increasing throughput.

A further advantage is that the donor element can be cleaned and reused.

A further advantage (relative to the vacuum-based technique) is that added techniques can be used for coating, including solvent-based coating such as spin coating, curtain coating, spray coating, Gravure-wheel coating, and others). Additional techniques can be used for facilitating the material transfer, such as vacuum hold-down. Additional techniques can be used for donor cleaning, such as solvent cleaning. It is also easier to place a radiation source in such an environment. It is also easier to provide a vacuum-based positioning of the donor on the substrate.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" refers to a device including organic light-emitting diodes, sometimes called an electroluminescent device, and an EL device, as described by Tang in commonly assigned U.S. Pat. No. 5,937,272 and by Littman and Tang in commonly assigned U.S. Pat. No. 5,688,551. The term "display" or "display panel" is employed to designate a screen capable of electronically displaying video images or text. The term "pixel" is employed in its art-recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary color from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels. The term "vacuum" is used herein to designate a pressure of 1 torr or less.

Figure 1:
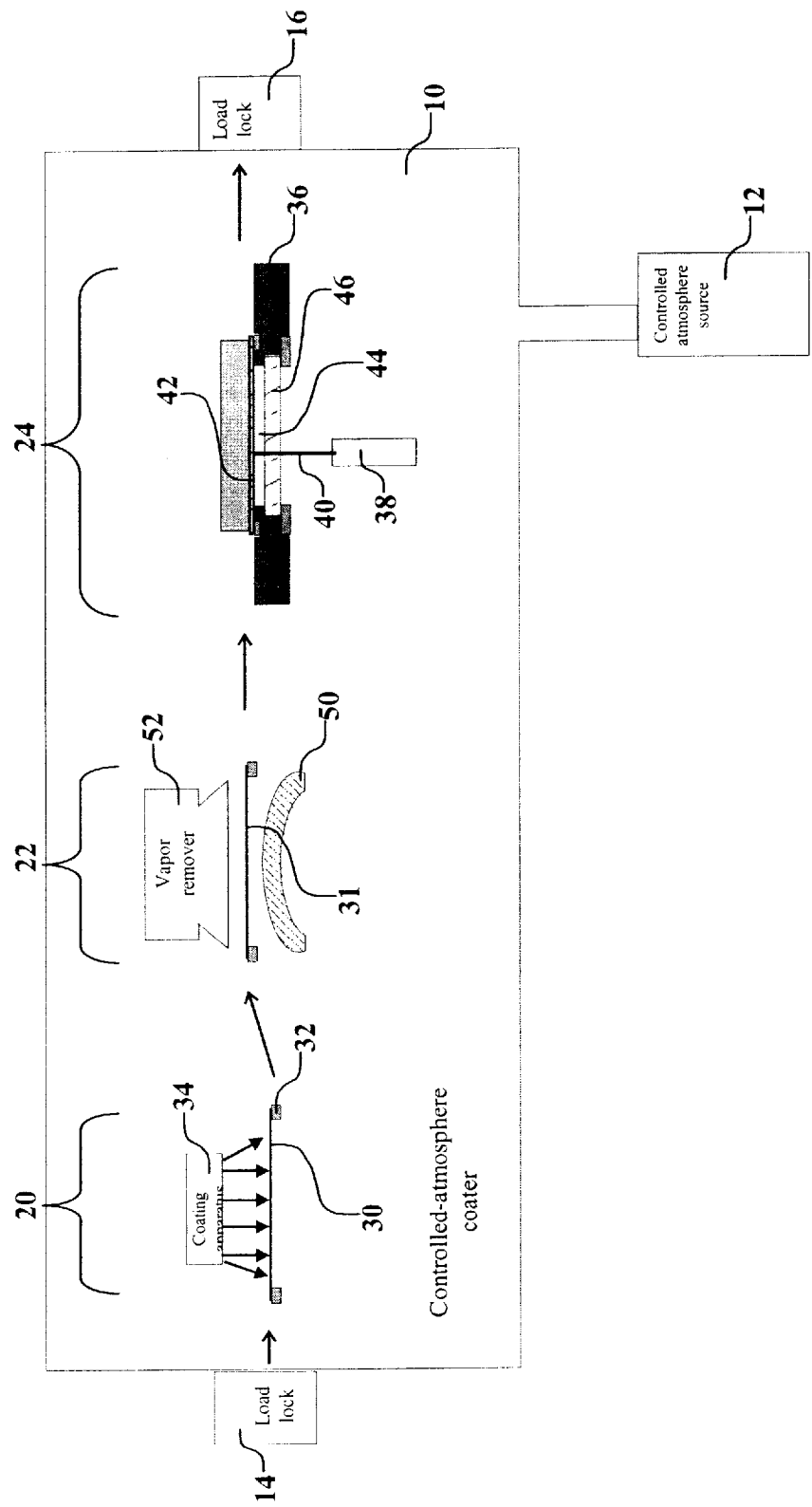
FIG. 1 is a cross-sectional representation of a first embodiment of this invention in which the donor support element is coated and the transfer to the substrate is effected in the same controlled-atmosphere coater.

Turning now to FIG. 1, we see a cross-sectional representation of one embodiment of this invention in which a donor support element 30 is coated and the transfer of the coating material to a receiver element 42 is effected in the same controlled-atmosphere chamber. Controlled-atmosphere coater 10 is an enclosed apparatus described herein that permits an in-situ method for fabricating an OLED device, that is, it permits a donor support element 30 to be coated by means such as curtain coating, spraying, gravure coating, and spin coating, and the coated material to be subsequently transferred to an OLED substrate such as receiver element 42 such as by thermal transfer, under controlled-atmosphere conditions. By controlled atmosphere conditions, we mean that the water vapor level is preferably 1000 ppm or less, or the oxygen level is preferably 1000 ppm or less, or both, at a total pressure greater than 1 torr. While it is impossible to reduce the quantities of water vapor and/or oxygen completely to zero, controlled atmosphere conditions can reduce the quantities of these components to very low or imperceptible levels, such as 0.001 ppm. Controlling the atmosphere can be achieved by various well-known methods, e.g. oxygen or water-vapor scrubbers, or the use of purified gasses. Controlled-atmosphere coater 10 can include one chamber, or any number of chambers that can be connected by load locks or similarly-acting apparatus such as tunnels or buffer chambers, whereby donor elements and receiver elements can be transported without exposure to moisture and/or oxygen. The conditions are maintained in controlled-atmosphere coater 10 by controlled-atmosphere source 12. Controlled-atmosphere coater 10 includes load lock 14, which is used to load the chamber with donor support elements 30. Controlled-atmosphere coater 10 also includes load lock 16, which is used to unload used donor elements 31. Load locks 14 and 16 are means of introducing and removing materials from controlled-atmosphere coater 10 without contaminating the conditions inside with the outside environment. The interior of controlled-atmosphere coater 10 can include coating station 20, solvent-removal station 22, and transfer station 24. Coating station 20 is a location within controlled-atmosphere coater 10 that permits a donor support element 30 to be coated by means such as curtain coating, spraying, gravure coating, and spin coating. Solvent-removal station 22 is a location within controlled-atmosphere coater 10 that removes any solvent used in the coating operation. Transfer station 24 is a location within controlled-atmosphere coater 10 that facilitates the transfer of the coated material to a receiver element 42, such as by thermal transfer.

Donor support element 30 is introduced to controlled-atmosphere coater 10 by means of load lock 14. Donor support element 30 is an element that can accept a coating layer by means such as curtain coating, spraying, gravure coating, and spin coating, and can subsequently transfer all or part of the coating such as by thermal transfer. Donor support element 30 can optionally be supported by donor support 32. Donor support element 30 is transferred by mechanical means to coating station 20. Coating station 20 includes coating apparatus 34. Coating apparatus 34 can consist of any apparatus capable of coating the materials to produce a uniform coating of a precise thickness on donor support element 30. Examples of suitable methods for coating donor support element 30 include curtain coating, spraying, solution coating, meniscus coating, dip coating, screen printing, and roll-to-roll coating. Using any one of these methods, a support coated with a predetermined thickness of the desired transferable organic donor material can be readily prepared in large quantity. For organic light-emitting devices, a preferred method for the preparation of a donor coating on a flexible donor support element is roll-to-roll coating because the coating thickness and uniformity on the support can be precisely controlled with an accuracy of better than a few percent. Additionally, multiple sources can be used at separate times within controlled-atmosphere coater 10 to coat separate layers on donor support element 30 or on receiver element 42, or can be used to coat additional donor support elements 30. Coating apparatus 34 is activated and donor support element 30 is coated evenly with material, rendering it into donor element 31. Donor element 31 is an element coated with one or more coated layers that can produce part or all of an OLED device and that can subsequently be transferred in whole or in part such as by thermal transfer.

The donor support element 30 can be made of any of several materials or combinations of materials which meet at least the following requirements: donor support element 30 must be sufficiently flexible and possess adequate tensile strength to tolerate coating steps and roll-to-roll or stacked-sheet transport of the support in the practice of the invention. Donor support element 30 must be capable of maintaining the structural integrity during the radiation-to-heat-induced transfer step while pressurized on one side, and during any preheating steps contemplated to remove volatile constituents such as water vapor. Additionally, donor support element 30 must be capable of receiving on one surface a relatively thin coating of material, and of retaining this coating without degradation during anticipated storage periods of the coated support. Support materials meeting these requirements include, for example, metal foils, plastic foils, and fiber-reinforced plastic foils. While selection of suitable support materials can rely on known engineering approaches, it will be appreciated that certain aspects of a selected support material merit further consideration when configured as donor support element 30 useful in the practice of the invention. For example, donor support element 30 can require a multi-step cleaning and surface preparation process prior to coating with material. If the support material is a radiation-transmissive material, the incorporation into donor support element 30 or onto a surface thereof, of a radiation-absorptive material can be advantageous to more effectively heat donor support element 30 and to provide a correspondingly enhanced transfer of material from donor element 31 to receiver element 42, when using a flash of radiation from a suitable radiation source such as laser light from a suitable laser.

A typical OLED device can contain the following layers, usually in this sequence: an anode, a hole-injecting layer, a hole-transporting layer, a light-emitting layer, an electron-transporting layer, a cathode. The material coated onto donor support element 30 can be a hole-injecting material, a hole-transport material, an electron-transport material, an emissive material, a host material, an anode material, a cathode material, a radiation-absorptive material, or a combination of any of these materials. The material can be moisture- and/or oxygen-sensitive, which means that the presence of water, water vapor, or oxygen, can negatively affect the performance or quality of the material.

Hole-Injecting (HI) Material

While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injecting materials reportedly useful in organic EL devices are described in EP 0 891 121 A1 and EP 1,029,909 A1.

Hole-Transport (HT) Material

Hole-transport materials useful as coated material are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al in commonly-assigned U.S. Pat. Nos. 3,567,450 and 3,658,520.

A more preferred class of aromatic tertiary amines are those which include at least two aromatic tertiary amine moieties as described in commonly-assigned U.S. Pat. Nos. 4,720,432 and 5,061,569. Such compounds include those represented by structural formula (A).

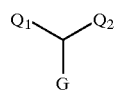

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

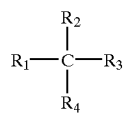

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by formula (C), linked through an arylene group. Useful tetraaryldiamines include those represented by formula (D).

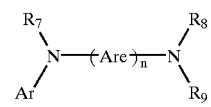

D wherein each Are is an independently selected arylene group, such as a phenylene or anthracene moiety, n is an integer of from 1 to 4, and Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane 1,1-Bis(4-di-p-tolylaminophenyl)-4-phenylcyclohexane 4,4'-Bis(diphenylamino)quadriphenyl Bis(4-dimethylamino-2-methylphenyl)-phenylmethane N,N,N-Tri(p-tolyl)amine 4-(di-p-tolylamino)-4'-[4(di-p-tolylamino)-styryl]stilbene N,N,N',N'-Tetra-p-tolyl-4-4'-diaminobiphenyl N,N,N',N'-Tetraphenyl-4,4'-diaminobiphenyl N-Phenylcarbazole Poly(N-vinylcarbazole), and N,N'-di-1-naphthalenyl-N,N'-diphenyl-4,4'-diaminobiphenyl.

4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transport materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly (3,4-ethylenedioxythiophene)/poly(4-styrenesulfonate) also called PEDOT/PSS.

Light-Emitting Material

Light-emitting materials useful as coated material are well known. As more fully described in commonly-assigned U.S. Pat. Nos. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in commonly-assigned U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721, and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g., green, yellow, orange, and red.

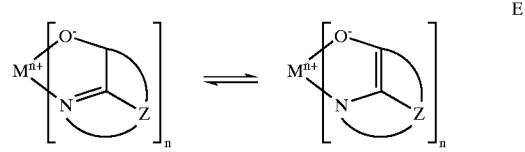

E wherein

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine[alias, tris(8-quinolinolato) aluminum(III)]

CO-2: Magnesium bisoxine[alias, bis(8-quinolinolato) magnesium(II)]

CO-3: Bis[benzo{f}-8-quinolinolato]zinc (II)

CO-4: Bis(2-methyl-8-quinolinolato)aluminum (III)-μ-oxo-bis(2-methyl-8-quinolinolato) aluminum(III)

CO-5: Indium trisoxine[alias, tris(8-quinolinolato) indium]

CO-6: Aluminum tris(5-methyloxine)[alias, tris(5-methyl-8-quinolinolato)aluminum(III)]

CO-7: Lithium oxine[alias, (8-quinolinolato)lithium(I)]

Derivatives of 9,10-di-(2-naphthyl)anthracene (Formula F) constitute one class of useful hosts capable of supporting electroluminescence, and are particularly suitable for light emission of wavelengths longer than 400 nm, e.g., blue, green, yellow, orange or red.

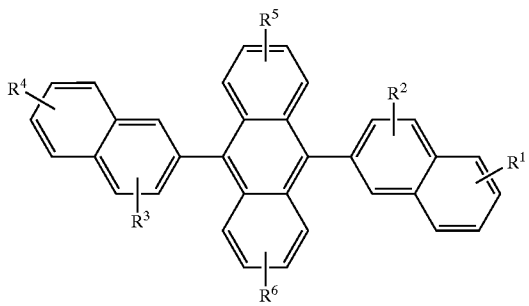

F

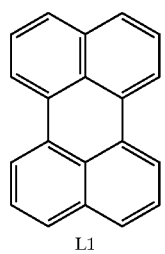

wherein: $R^1$, $R^2$, $R^3$, and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Benzazole derivatives (Formula G) constitute another class of useful hosts capable of supporting electroluminescence, and are particularly suitable for light emission of wavelengths longer than 400 nm, e.g., blue, green, yellow, orange or red.

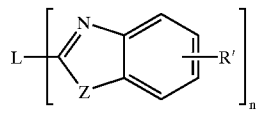

G

Where:

n is an integer of 3 to 8;

Z is O, NR or S; and

R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring;

L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

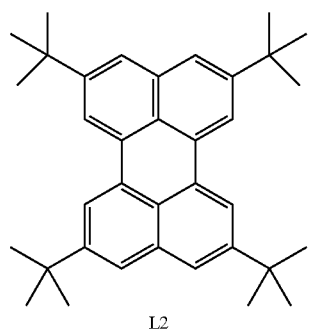

L1

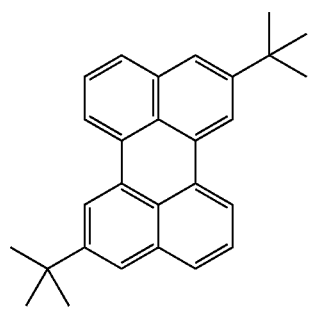

L2

L3

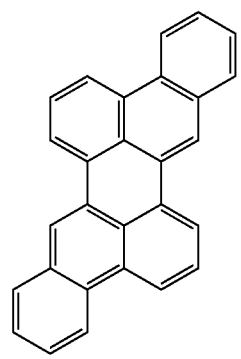

L4

-continued
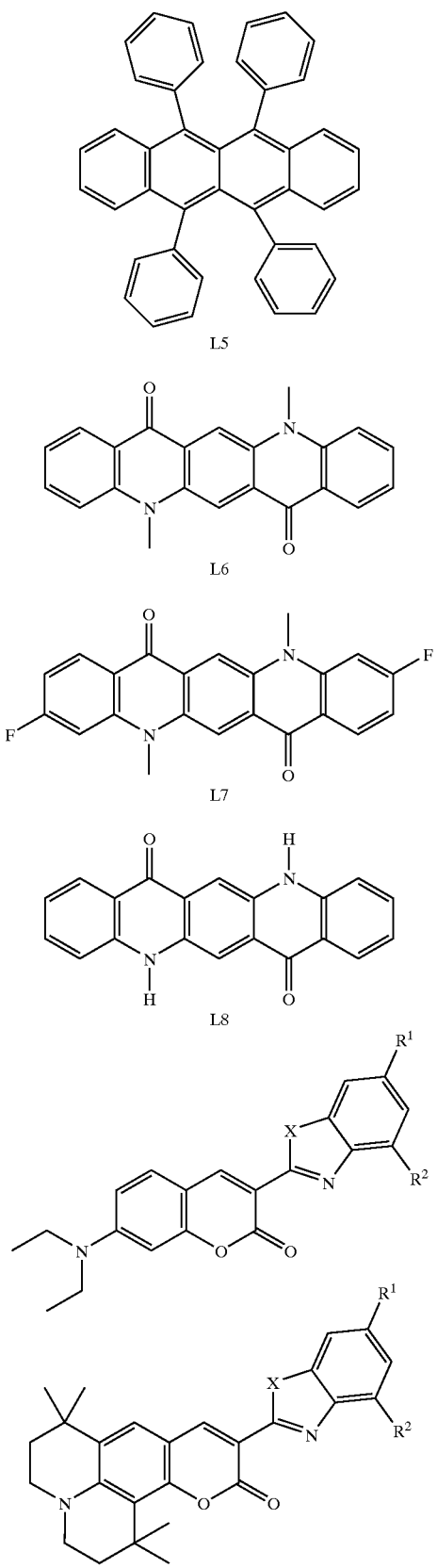
| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

-continued

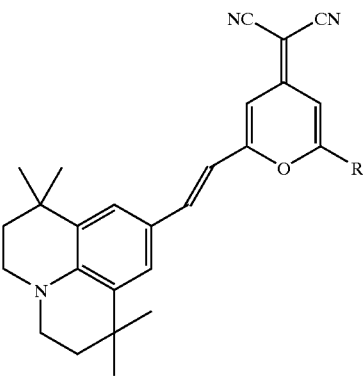

| | R |
|---|---|
| L37 | phenyl |
| L38 | methyl |
| L39 | t-butyl |
| L40 | mesityl |

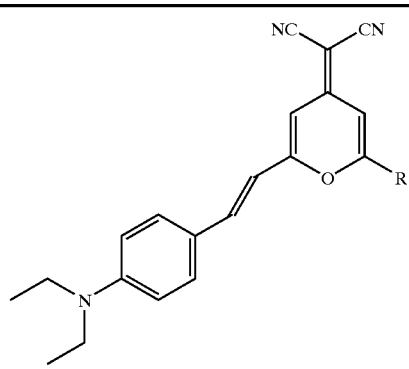

| | R |
|---|---|
| L41 | phenyl |
| L42 | methyl |
| L43 | t-butyl |
| L44 | mesityl |

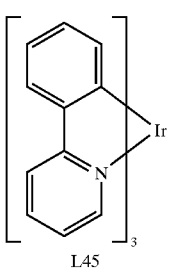

L45

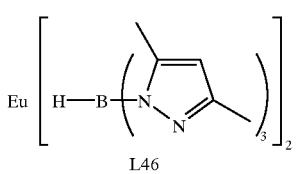

L46

-continued

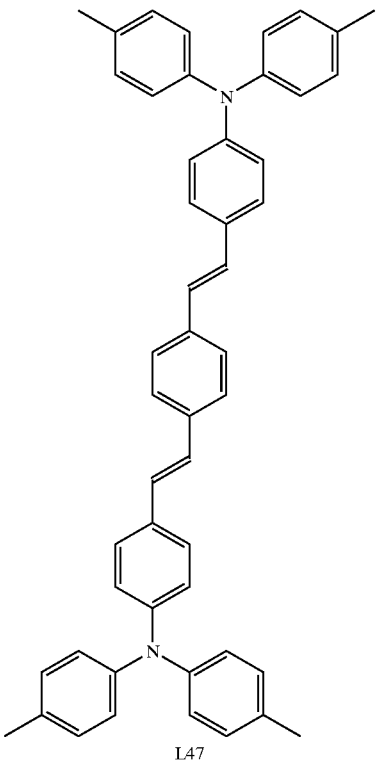

L47

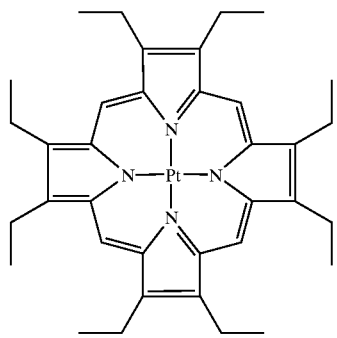

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al in commonly assigned U.S. Pat. No. 6,194,119 B1 and references therein.

Electron-Transport (ET) Material

Preferred electron transport materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in commonly-assigned U.S. Pat. No. 4,356,429 and various heterocyclic optical brighteners as described in commonly-assigned U.S. Pat. No. 4,539,507. Benzazoles satisfying structural formula (G) are also useful electron transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

In some instances, a single layer can serve the function of supporting both light emission and electron transportation, and will therefore include emissive material and electron transport material.

Anode Material

The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well-known photolithographic processes.

Cathode Material

When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in commonly-assigned U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in commonly-assigned U.S. Pat. No. 5,677,572. Other useful cathode materials include, but are not limited to, those disclosed in commonly-assigned U.S. Pat. Nos. 5,059,861; 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in commonly-assigned U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in commonly-assigned U.S. Pat. No. 5,276,380 and EP 0 732 868, laser ablation, and selective chemical vapor deposition.

Radiation-Absorptive Material

Radiation-absorbing material can be a dye such as the dyes specified in commonly assigned U.S. Pat. No. 5,578,416, a pigment such as carbon, or a metal such as nickel, chromium, titanium, etc.

In many types of coating, including spin coating, spray coating, and gravure coating, the coating material can be dissolved in a solvent for ease of coating. The solvent is subsequently removed. Donor element 31 is transferred by mechanical means from coating station 20 to solvent removal station 22. Heater 50 heats donor element 31 enough to evaporate solvent, which is removed by vapor remover 52, but the heat applied is insufficient to remove any desired coating material.

Receiver element 42 is introduced to controlled-atmosphere coater 10 by means of load lock 16 and transferred by mechanical means to transfer apparatus 36. This can occur before, after, or during the introduction of donor support element 30. Transfer apparatus 36 can consist of any apparatus capable of facilitating the transfer of coated materials on donor element 31, in response to heat or radiation converted to heat. One example of transfer apparatus 36, its construction, and its means of operation with donor element 31 and receiver element 42 have already been described in the above-cited commonly-assigned U.S. patent application Ser. No. 10/021,310 to Phillips et al, the disclosure of which is incorporated by reference. Transfer apparatus 36 is shown for convenience in the closed configuration, but it also has an open configuration in which donor element 31 and receiver element 42 loading and unloading occurs. Donor element 31 is transferred by mechanical means from solvent-removal station 22 to transfer station 24. Donor element 31 and receiver element 42 are positioned in a material transferring relationship, that is, the coated side of donor element 31 is positioned in close contact with the receiving surface of receiver element 42 and held in place by a means such as fluid pressure in pressure chamber 44, as described by Phillips, et al. Donor element 31 can then be irradiated through transparent portion 46 by applied radiation, for example by laser beam 40 from laser 38. The irradiation of donor element 31 in a predetermined pattern selectively transfers one or more layers of coated material from donor element 31 to receiver element 42 so that material will coat selected portions of receiver element 42, as described by Phillips et al.

Receiver element 42 can be an organic solid, an inorganic solid, or a combination of organic and inorganic solids that provides a surface for receiving the emissive material from a donor. Receiver element 42 can be rigid or flexible and can be processed as separate individual pieces, such as sheets or wafers, or as a continuous roll. Typical receiver element materials include glass, plastic, metal, ceramic, semiconductor, metal oxide, semiconductor oxide, semiconductor nitride, or combinations thereof. Receiver element 42 can be a homogeneous mixture of materials, a composite of materials, or multiple layers of materials. Receiver element 42 can be an OLED substrate, that is a substrate commonly used for preparing OLED devices, e.g. active-matrix lowtemperature polysilicon TFT substrate. The receiver element 42 can either be light transmissive or opaque, depending on the intended direction of light emission. The light transmissive property is desirable for viewing the EL emission through receiver element 42. Transparent glass or plastic are commonly employed in such cases. For applications where the EL emission is viewed through the top electrode, the transmissive characteristic of receiver element 42 is immaterial, and therefore can be light transmissive, light absorbing or light reflective. Receiver elements for use in this case include, but are not limited to, glass, plastic, semiconductor materials, ceramics, and circuit board materials. Receiver element 42 can be treated with one or more coated layers of the above-described materials (e.g. an anode material, a cathode material, a hole-transport material, etc.) before undergoing the method herein. Receiver element 42 can further be treated with one or more coated layers of the above described materials (e.g. an anode material, a cathode material, an electron-transport material, etc.) and with protective layers after undergoing the method herein. These treatments can be effected outside of controlled-atmosphere coater 10 or inside controlled-atmosphere coater 10 at coating station 20.

After irradiation is complete, transfer apparatus 36 is opened and donor element 31 and receiver element 42 can be removed via load lock 16. Alternatively, receiver element 42 can remain at transfer station 24. Additional donor support elements 31 are coated at coating station 20, dried at solvent-removal station 22, placed in a material transferring relationship with receiver element 42, then irradiated by applied radiation as described above. This process can transfer an additional one or more layers of coated material to receiver element 42 to produce all or part of the moisture-sensitive or oxygen-sensitive or moisture-and-oxygen-sensitive device.

Figure 2:
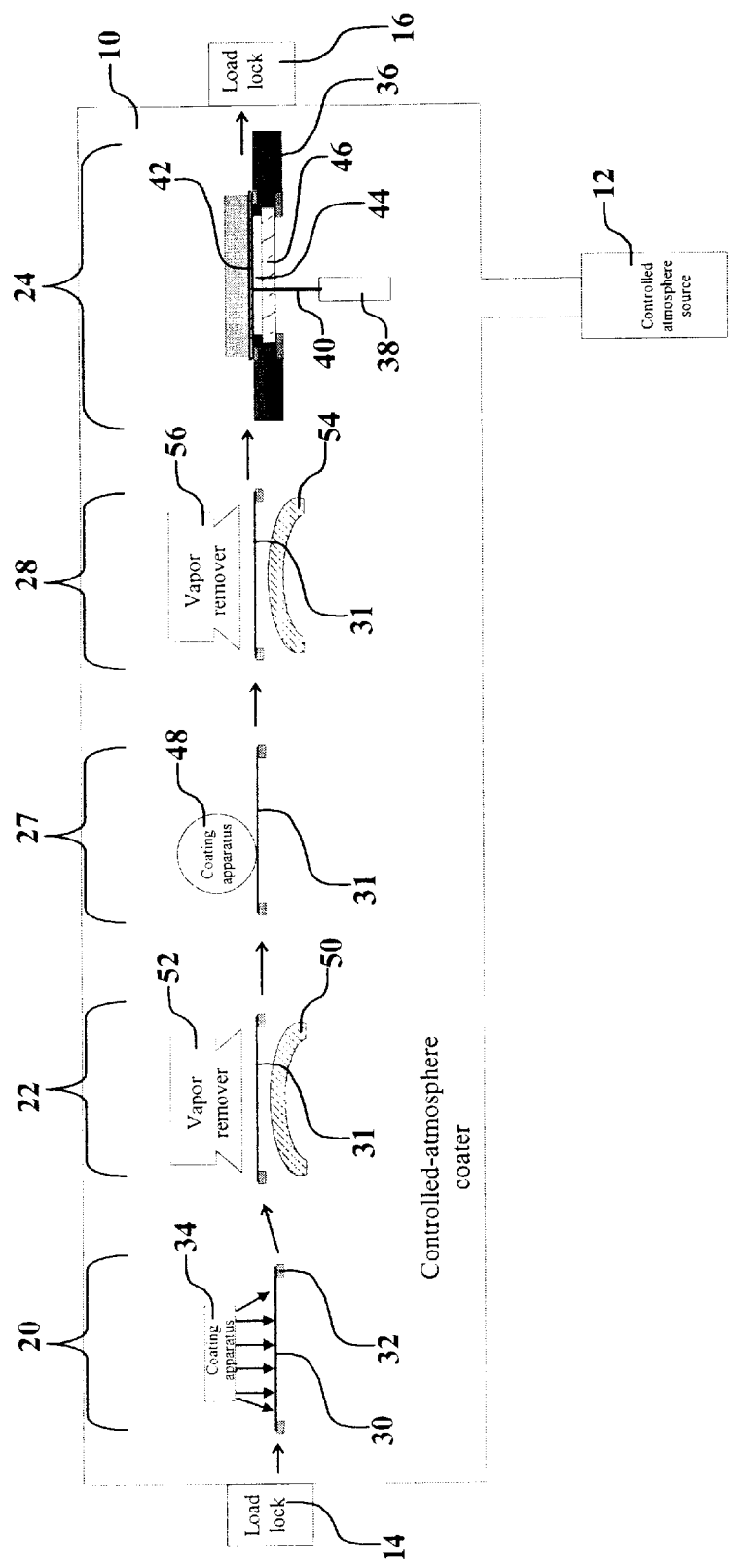
FIG. 2 is a cross-sectional representation of another embodiment of this invention in which the donor support element is coated with more than one layer and the transfer to the substrate is effected in the same controlled-atmosphere coater.

Turning now to FIG. 2, we see a cross-sectional representation of another embodiment of this invention in which the donor support element is coated with more than one layer and the transfer to the receiver element is effected in the same controlled-atmosphere chamber. The conditions are maintained in controlled-atmosphere coater 10 by controlled-atmosphere source 12. Controlled-atmosphere coater 10 includes load lock 14, which is used to load the chamber with fresh donor support elements. Controlled-atmosphere coater 10 also includes load lock 16, which is used to unload used donor elements. The interior of controlled-atmosphere coater 10 includes coating station 20, solvent-removal station 22, coating station 27, solvent-removal station 28, and transfer station 24.

Donor support element 30 is introduced to controlled-atmosphere coater 10 by means of load lock 14. Donor support element 30 can optionally be supported by donor support 32. Donor support element 30 is transferred by mechanical means to coating station 20, which includes coating apparatus 34. Coating apparatus 34 is activated and donor support element 30 is coated evenly with coating material, rendering it into donor element 31.

If the coating material is dissolved in a solvent for ease of coating, the solvent is subsequently removed. Donor element 31 is transferred by mechanical means from coating station 20 to solvent removal station 22. Heater 50 heats donor element 31 enough to evaporate solvent, which is removed by vapor remover 52, but the heat applied is insufficient to remove any desired coating material.

Donor element 31 is transferred by mechanical means from solvent-removal station 22 to coating station 27, which includes a coating apparatus, here represented by gravure wheel 48. The coating apparatus is activated and donor element 31 is coated evenly with an additional layer of coating material.

If the coating material is dissolved in a solvent for ease of coating, the solvent is subsequently removed. Donor element 31 is transferred by mechanical means from coating station 27 to solvent removal station 28. Heater 54 heats donor element 31 enough to evaporate solvent, which is removed by vapor remover 56, but the heat applied is insufficient to remove any desired coating material.

Receiver element 42 is introduced to controlled-atmosphere coater 10 by means of load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occurs. Donor support element 31 is transferred by mechanical means from solvent-removal station 28 to transfer station 24. Donor element 31 and receiver element 42 are positioned in a material transferring relationship, that is, the coated side of donor element 31 is positioned in close contact with the receiving surface of receiver element 42 and held in place by fluid pressure in pressure chamber 44 as described in Phillips et al. Donor element 31 is then irradiated through transparent portion 46 by applied radiation, for example by laser beam 40 from laser 38. The irradiation of donor element 31 in a predetermined pattern selectively transfers one or more layers of coated material from donor element 31 to receiver element 42 so that material will coat selected portions of receiver element 42, as described by Phillips et al.

After irradiation is complete, transfer apparatus 36 is opened and donor element 31 and receiver element 42 can be removed via load lock 16.

While this embodiment illustrates the coating and transfer of two layers, it will readily be apparent to those skilled in the art that three or more layers can be coated and transferred in this way.

Alternatively, the embodiment in FIG. 2 can be used to transfer more than one layer to the receiver element in different patternwise transfers. In this method, a plurality of donor support elements 30 are introduced to controlled-atmosphere coater 10 such that each coating station 20 and 27 is provided with a unique donor support element 30. Each donor support element 30 is coated evenly with coating material by its respective coating apparatus, thus rendering each into a unique donor element 31.

In this embodiment, each donor element 31 is transferred sequentially by mechanical means from its respective coating station (20 or 27) to its respective solvent-removal station (22 or 28) and then sequentially to transfer station 24. Receiver element 42 is introduced to controlled-atmosphere coater 10 by means of load lock 16 and transferred by mechanical means to transfer apparatus 36. This can occur before, after, or during the introduction of donor support elements 30. Transfer apparatus 36 is shown for convenience in the closed configuration, but it also has an open configuration in which the donor element and substrate loading and unloading occurs. Donor element 31 and receiver element 42 are positioned in a material transferring relationship, that is, the coated side of donor element 31 is positioned in close contact with the receiving surface of receiver element 42 and held in place by fluid pressure in pressure chamber 44 as described in Phillips et al. Donor element 31 is then irradiated through transparent portion 46 by applied radiation such as by laser beam 40 from laser 38. The irradiation of donor element 31 in a pattern causes the transfer of coated material from donor element 31 to receiver element 42, as described by Phillips et al.

After irradiation is complete, transfer apparatus 36 is opened and donor element 31 can be removed via load lock 16. The second donor element 31 is transferred by mechanical means to transfer station 24 and the transfer process is repeated. The transfer process in the several transfer operations can follow the same pattern of laser irradiation, or each transfer can be effected using a different pattern of laser irradiation.

It will be clear to those skilled in the art that this process can be used in the manufacture of a full-color display device, such as a full-color OLED device. Such devices generally are comprised of red, green, and blue subpixels. For example, a controlled-atmosphere coater 10 with three coating stations can be used to prepare three donor elements 31 from three donor support elements 30 that are provided to controlled-atmosphere coater 10. Each donor element 31 is prepared with a coating of a different organic emissive layer to reflect the desired output color or hue, that is with either a red, blue, or green emissive layer. Each donor element 31 is transferred sequentially by mechanical means from its respective coating station to its respective solvent-removal station and then to transfer station 24, sequentially positioned in a material transferring relationship to receiver element 42, that is, the coated side of donor element 31 is sequentially positioned in close contact with the receiving surface of receiver element 42, and radiation is sequentially applied through transparent portion 46 by such means as laser beam 40 from laser 38. The irradiation of donor element 31 in a pattern causes the patternwise transfer of the layer or layers of coated material from donor element 31 to receiver element 42, as described by Phillips et al. For example, the red emissive material is transferred patternwise to the desired red subpixels, the blue emissive material is transferred patternwise to the desired blue subpixels, and the green emissive material is transferred patternwise to the desired green subpixels. Receiver element 42 can be treated with one or more layers of materials (e.g. an anode material, a cathode material, a hole-transport material, etc.) before undergoing the method herein. Receiver element 42 can further be treated with one or more layers of materials (e.g. an anode material, a cathode material, an electron-transport material, etc.) and with protective layers after undergoing the method herein. These treatments can be effected outside of controlled-atmosphere coater 10 or inside controlled-atmosphere coater 10 at coating station 20.

Figure 3:
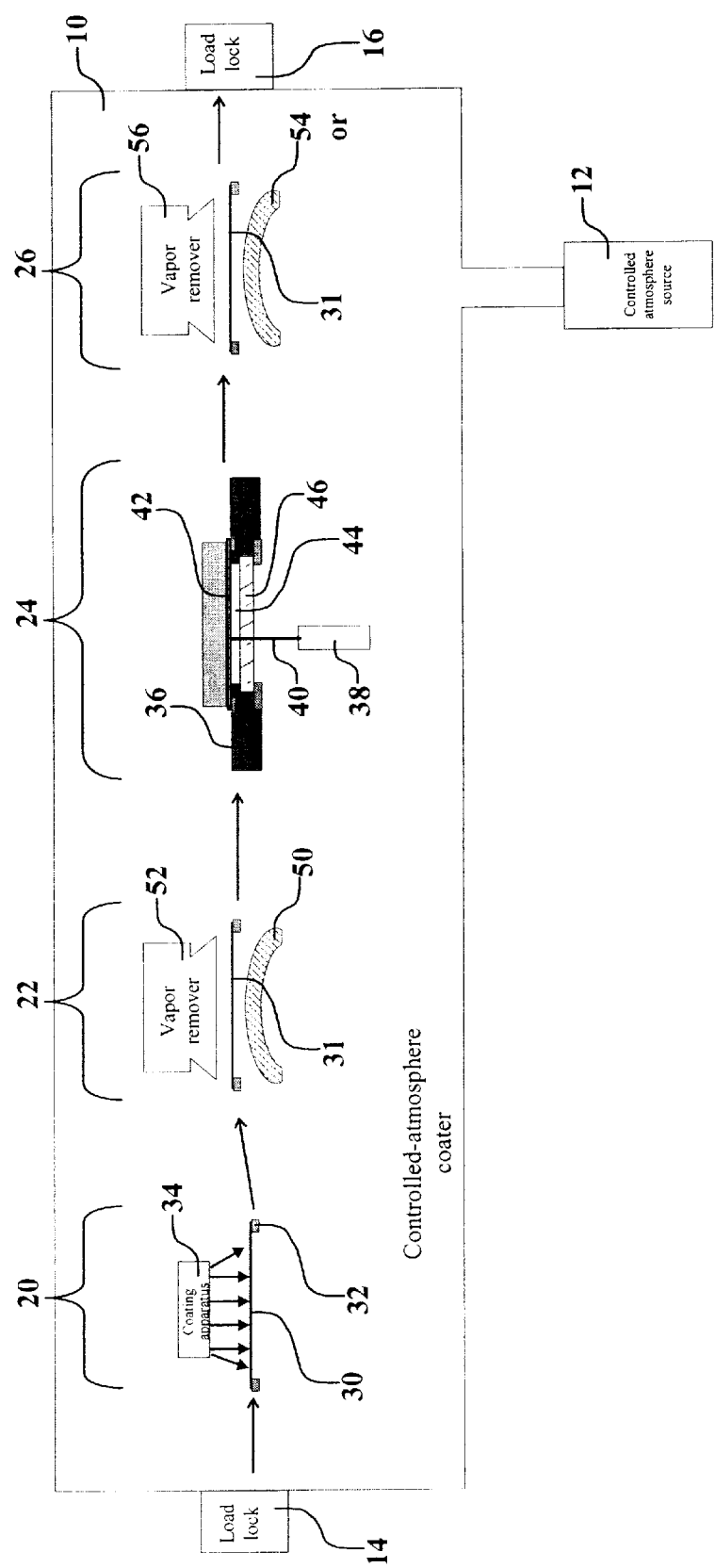
FIG. 3 is a cross-sectional representation of another embodiment of this invention in which the donor support element is coated, the transfer to the substrate is effected, and remaining coated material on the donor element is removed in the same controlled-atmosphere coater.

Turning now to FIG. 3, we see a cross-sectional representation of another embodiment of this invention in which the donor support element is coated, the transfer to the substrate is effected, and remaining coated material on the donor element is removed in the same controlled-atmosphere coater. Controlled-atmosphere coater 10 is held under controlled-atmosphere conditions by controlled-atmosphere source 12. Controlled-atmosphere coater 10 includes load lock 14, which is used to load the chamber with fresh donor support elements. Controlled-atmosphere coater 10 also includes load lock 16, which is used to unload used donor elements. The interior of controlled-atmosphere coater 10 includes coating station 20, solvent-removal station 22, transfer station 24, and cleaning station 26.

Donor support element 30 is introduced to controlled-atmosphere coater 10 by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor support element 30 is coated evenly with coating material, rendering it into donor element 31.

In many types of coating, including spin coating, spray coating, and gravure coating, the coating material can be dissolved in a solvent for ease of coating. The solvent is subsequently removed. Donor element 31 is transferred by mechanical means from coating station 20 to solvent removal station 22. Heater 50 heats donor element 31 enough to evaporate solvent, which is removed by vapor remover 52, but the heat applied is insufficient to remove any desired coating material.

Receiver element 42 is introduced to controlled-atmosphere coater 10 by means of load lock 14 or load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occurs. Donor support element 31 is transferred by mechanical means from solvent-removal station 22 to transfer station 24. Donor element 31 and receiver element 42 are positioned in a material transferring relationship, that is, the coated side of donor element 31 is positioned in close contact with the receiving surface of receiver element 42 and held in place by fluid pressure in pressure chamber 44, as described in Phillips et al. Donor element 31 is then irradiated through transparent portion 46 by applied radiation, for example by laser beam 40 from laser 38. The irradiation of donor element 31 in a predetermined pattern selectively transfers one or more layers of coated material from donor element 31 to receiver element 42 so that material will coat selected portions of receiver element 42, as described by Phillips et al.

After irradiation is complete, transfer apparatus 36 is opened and receiver element 42 can be removed via load lock 16 or load lock 14. Donor element 31 is transferred by mechanical means to cleaning station 26. Cleaning station 26 is a location within controlled-atmosphere coater 10 that permits a means for cleaning donor element 31, that is removing coated material from donor element 31 so that donor support element 30 can be reused and recoated. Cleaning station 26 includes heater 54 or a radiation source such as flash lamp 51 and vapor remover 56. Donor element 31 is heated by heater 54 or a radiation source such as flash lamp 51 in the process of cleaning it, that is, heating or radiation causes coated material of donor element 31 to vaporize or sublime and be removed by vapor remover 56. Vapor remover 56 can be e.g. a vacuum port inlet, a cold trap, a removable shield, etc. Donor element 31 is now donor support element 30 and can be removed by mechanical means via load lock 16. Alternatively, donor support element 30 can be transferred by mechanical means to coating station 20 to be recoated and reused.

These operations can be simultaneous at the various stations. For example, a donor element 31 can be used in a radiation-induced transfer at transfer station 24, while a previously-transferred donor element 31 is being heated or irradiated at cleaning station 26 and an uncoated donor support element 30 is being coated at coating station 20.

Figure 4:
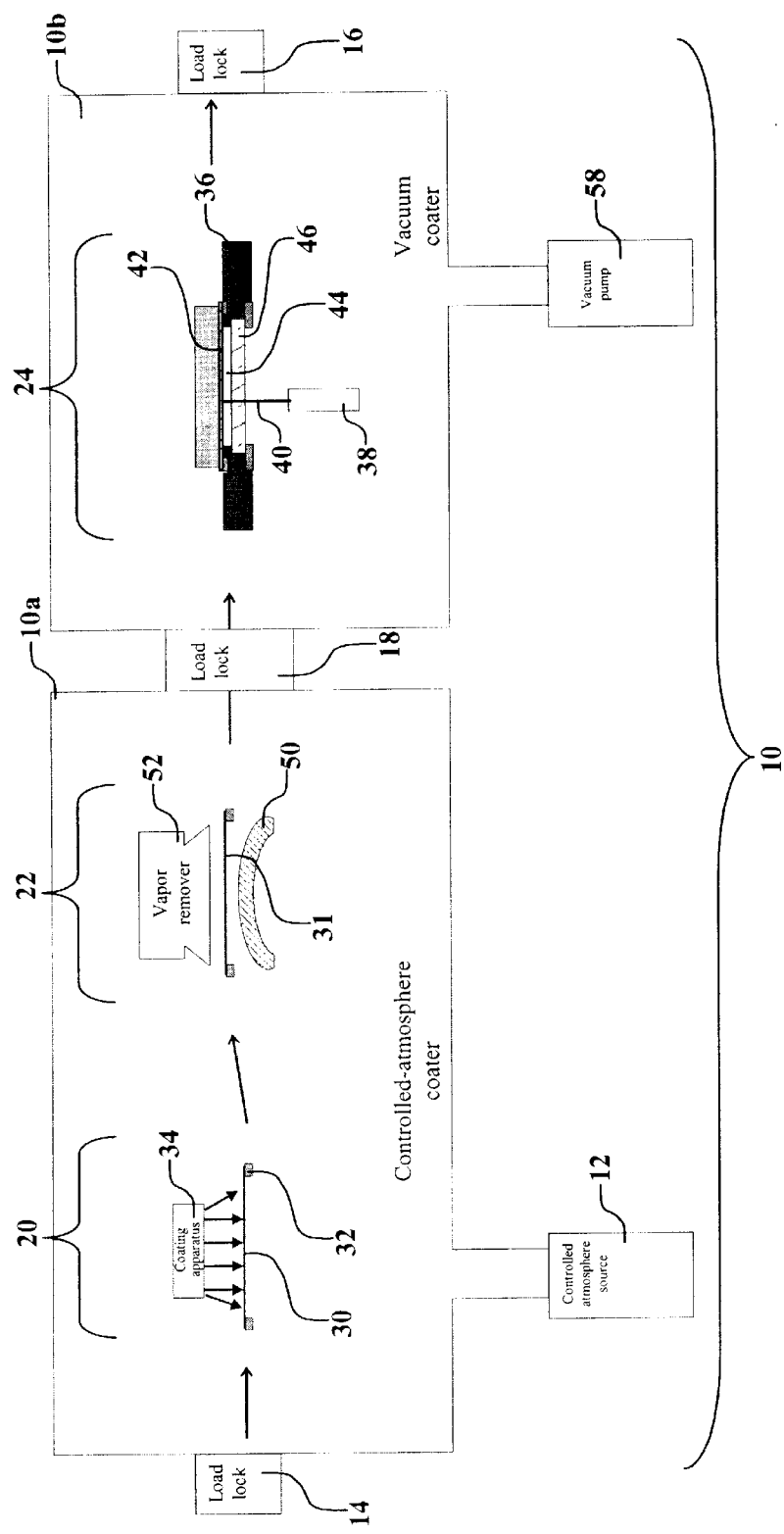
FIG. 4 is a cross-sectional representation of another embodiment of this invention in which the donor support element is coated and the transfer to the substrate is effected in different connected chambers joined by a load lock.

Turning now to FIG. 4, we see a cross-sectional representation of another embodiment of this invention in which the donor support element is coated and the transfer to the substrate is effected in different connected chambers. The separate chambers can be controlled-atmosphere chambers or controlled-atmosphere coaters as described herein, or one can be a vacuum chamber or vacuum coater as previously described in the above-cited commonly assigned U.S. patent application Ser. No. 10/033,459, by Boroson et al the disclosure of which is incorporated by reference. Controlled-atmosphere coater 10 in this embodiment includes coating chamber 10a and transfer chamber 10b. One chamber, for example coating chamber 10a, is held under controlled-atmosphere conditions by controlled atmosphere source 12 and is therefore a controlled-atmosphere coater, while the other chamber, for example transfer chamber 10b, is held under vacuum by vacuum pump 58 and is therefore a vacuum coater. By controlled atmosphere conditions, we mean that the water vapor level is preferably 1000 ppm or less, or the oxygen level is preferably 1000 ppm or less, or both. Controlling the atmosphere can be achieved by various well-known methods, e.g. oxygen or water-vapor scrubbers, or the use of purified gasses. By vacuum, we mean a pressure of 1 torr or less. The chambers are connected by load lock 18. Controlled-atmosphere coater 10 includes load lock 14, which is used to load the chamber with fresh uncoated donor support elements 30. Controlled-atmosphere coater 10 also includes load lock 16, which is used to unload used donor elements. The interior of controlled-atmosphere coater 10 includes coating station 20 and solvent-removal station 22 in coating chamber 10a, and transfer station 24 in transfer chamber 10b.

Donor support element 30 is introduced to coating chamber 10a by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor 30 is coated evenly with a layer of coating material that is required to produce part of or all of an OLED device, rendering it into donor element 31.

In many types of coating, including spin coating, spray coating, and gravure coating, the coating material can be dissolved in a solvent for ease of coating. The solvent is subsequently removed. Donor element 31 is transferred by mechanical means from coating station 20 to solvent removal station 22. Heater 50 heats donor element 31 enough to evaporate solvent, which is removed by vapor remover 52, but the heat applied is insufficient to remove any desired coating material.

The coating and drying steps can be repeated to form additional layers of material on donor element 31.

Receiver element 42 is introduced to transfer chamber 10b by means of load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occur. Donor element 31 is transferred by mechanical means from solvent-removal station 22 through load lock 18 to transfer station 24. Donor element 31 and receiver element 42 are positioned in a material transferring relationship, that is, the coated side of donor element 31 is positioned in close contact with the receiving surface of receiver element 42 and held in place by a means such as fluid pressure in pressure chamber 44, as described by Phillips, et al. Donor element 31 is then irradiated through transparent portion 46 by applied radiation, for example by laser beam 40 from laser 38. The irradiation of donor element 31 in a predetermined pattern selectively transfers one or more layers of coated material from donor element 31 to receiver element 42 so that material will coat selected portions of receiver element 42, as described by Phillips et al.

After irradiation is complete, transfer apparatus 36 is opened and donor element 31 and receiver element 42 can be removed via load lock 16. Alternatively, donor element 31 can be removed via load lock 16 while receiver element 42 is left in place. The transfer process can then be repeated using receiver element 42 and a new donor element 31.

It will be clear that variations on this procedure can be effected. Receiver element 42 can be coated at coating station 20 and if necessary dried at solvent-removal station 22, with additional layers of materials useful in OLED fabrication. Such coating can occur before, after, or both before and after the radiation-induced transfer. For example, a receiver element 42 can have successively applied to it a hole-transport material at coating station 20, an emissive material at transfer station 24, and an electron-transport material at coating station 20.

The conditions in the chambers can be reversed. That is, coating chamber 10a can be held under vacuum, thus making it a vacuum coater, while transfer chamber 10b can be held under controlled-atmosphere conditions, thus making it a controlled-atmosphere coater. Thus donor support element 30 will be coated in the vacuum coater, while the transfer from donor element 31 to receiver element 42 is effected in the controlled-atmosphere coater.

Alternative arrangements of chambers are possible. For example, coating chamber 10a and transfer chamber 10b can be unattached chambers, as described the above-cited commonly assigned U.S. patent application Ser. No. 10/033,459, by Boroson et al the disclosure of which is incorporated by reference. Such an arrangement would include a transport chamber capable of maintaining a controlled atmosphere or a vacuum or both.

Figure 5:
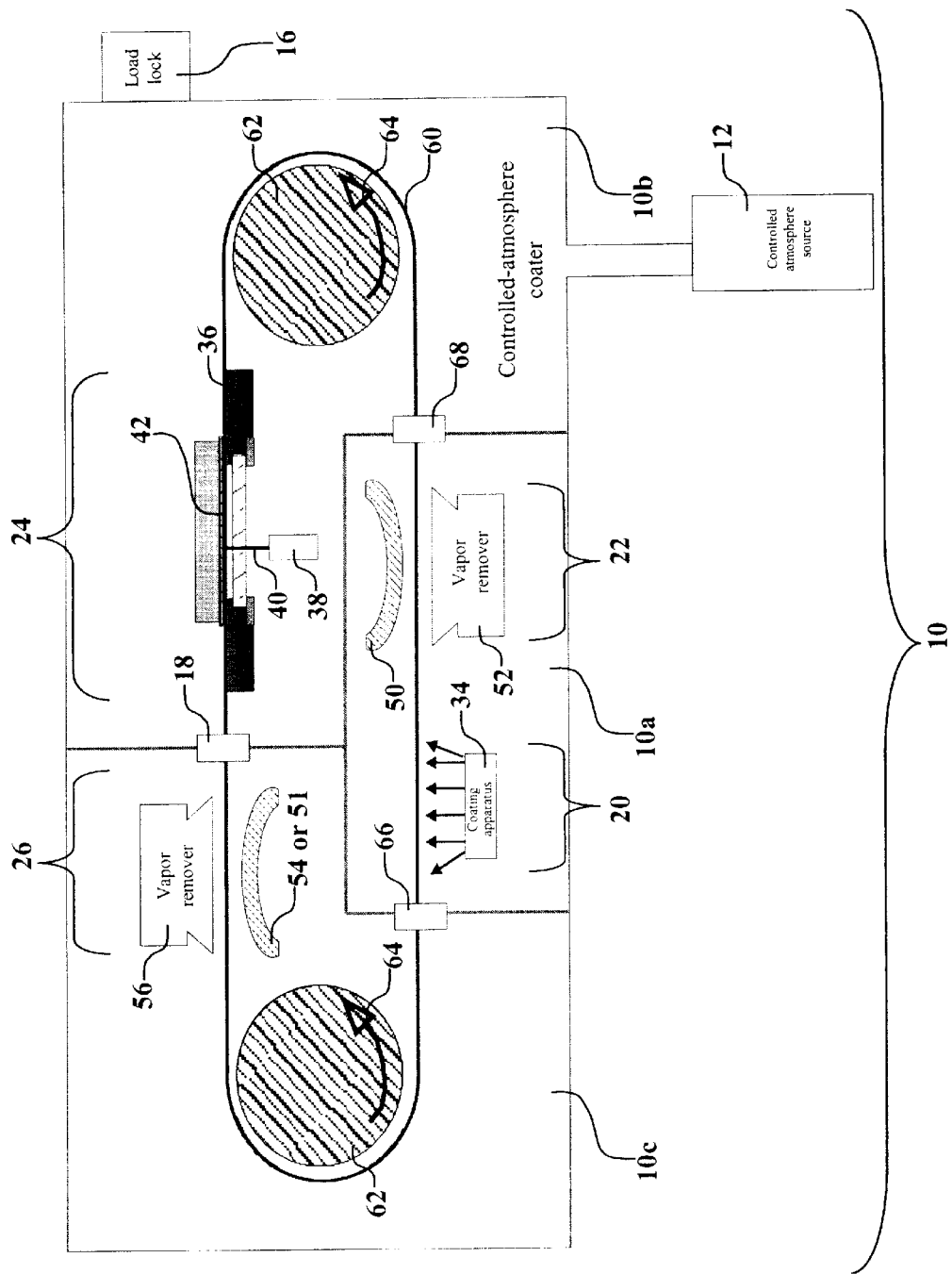
FIG. 5 is a cross-sectional representation of another embodiment of this invention in which the donor support element is part of a continuous web that is coated, the transfer to the substrate is effected, and remaining coated material on the donor element is removed in the same coater.

Turning now to FIG. 5, we see a cross-sectional representation of another embodiment of this invention in which the donor element is part of a continuous moveable web, that is, it forms a continuous sheet that is coated, the transfer to the substrate is effected, and remaining coated material on the donor element is removed in the same coater. Controlled-atmosphere coater 10 is held under controlled-atmosphere conditions by controlled-atmosphere source 12. Controlled-atmosphere coater 10 includes load lock 16, which is used to load and unload substrate. The interior of controlled-atmosphere coater 10 includes moveable web 60, which is a continuous sheet of donor support element 30. Moveable web 60 is held on wheels 62 that turn in direction of travel 64. The interior of controlled-atmosphere coater 10 also includes coating station 20, solvent-removal station 22, transfer station 24, and cleaning station 26 arrayed along the path of moveable web 60. Controlled-atmosphere coater 10 can be divided into two or more chambers, e.g. coating chamber 10a, transfer chamber 10b, and cleaning chamber 10c. The separate chambers can be used to separate operations or to allow some parts of the process to be under controlled atmosphere while other parts are under vacuum. The separate chambers are connected by load locks 18, 66, and 68, which allow movement of moveable web 60 between the chambers.

Moveable web 60 is rotated by means of wheels 62 when transfer apparatus 36 is in the open configuration. An uncoated portion of moveable web 60 is moved into coating station 20, which includes coating apparatus 34. Coating apparatus 34 is activated (e.g. desired coating material is heated to vaporize it) and a part of moveable web 60 is coated evenly with coating material. Thus, a portion of moveable web 60 has become donor element 31.

In many types of coating, including spin coating, spray coating, and gravure coating, the coating material can be dissolved in a solvent for ease of coating. The solvent is subsequently removed. Moveable web 60 is rotated by means of wheels 62 so that a coated portion of moveable web 60 is transferred from coating station 20 to solvent removal station 22. Heater 50 heats moveable web 60 enough to evaporate solvent, which is removed by vapor remover 52, but the heat applied is insufficient to remove any desired coating material.

Receiver element 42 is introduced to controlled-atmosphere coater 10 by means of load lock 16 and transferred by mechanical means to transfer apparatus 36. Transfer apparatus 36 is shown for convenience in the closed configuration, but it also has an open configuration in which the donor element and substrate loading and unloading occurs. Moveable web 60 is rotated by means of wheels 62 when transfer apparatus 36 is in the open configuration, which moves a coated portion of moveable web 60 from solvent-removal station 22 to transfer station 24. This can occur before, during, or after the introduction of receiver element 42. The coated side of moveable web 60 at transfer station 24 is positioned in a material transferring relationship with receiver element 42, that is moveable web 60 is positioned in close contact with receiver element 42 and held in place by fluid pressure in pressure chamber 44, as described by Phillips et al. Moveable web 60 is then irradiated through transparent portion 46 by applied radiation, for example by laser beam 40 from laser 38. The irradiation of a coated portion of moveable web 60 in a predetermined pattern by laser beam 40 selectively transfers one or more layers of coated material from moveable web 60 to receiver element 42 so that material will coat selected portions of receiver element 42, as described by Phillips et al.

After irradiation is complete, transfer apparatus 36 is opened and receiver element 42 is removed via load lock 16. Moveable web 60 is rotated by means of wheels 62 when transfer apparatus 36 is in the open configuration, which moves the used coated portion of moveable web 60 from transfer station 24 to cleaning station 26. Cleaning station 26 includes heater 50 or a radiation source such as flash lamp 51 and vapor removal means 52. A portion of moveable web 60 is heated by heater 54 or a radiation source such as flash lamp 51, which cleans it, that is, it causes coated material of a coated portion of moveable web 60 to vaporize or sublime and be removed by vapor remover 56. Moveable web 60 is rotated by means of wheels 62 when transfer apparatus 36 is in the open configuration, which moves the now-uncoated portion of moveable web 60 from cleaning station 26 to coating station 20 for recoating and reuse.

These operations can be simultaneous at the various stations. For example, a portion of moveable web 60 can be used in a radiation-induced transfer at transfer station 24, while a previously-transferred portion of moveable web 60 is being heated or irradiated at cleaning station 26 and an uncoated portion of moveable web 60 is being coated at coating station 20.

In an alternate embodiment, moveable web 60 can be a long, but not continuous sheet. This can be accomplished by the use of unwind and take-up rolls before and after the various stations.

Figure 6A:
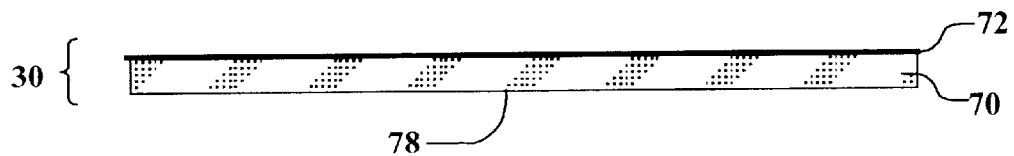
FIG. 6a is a cross-sectional representation of the structure of the uncoated donor element.

Turning now to FIG. 6a, we see one example of a cross-sectional representation of the structure of an uncoated donor element. Donor support element 30 includes at the minimum a flexible support 70, which includes non-transfer surface 78. Flexible support 70 has been uniformly coated with radiation-to-heat conversion layer 72. Radiation-to-heat conversion layer 72 includes material capable of absorbing radiation at the wavelength of interest and emitting heat.

Figure 6B:
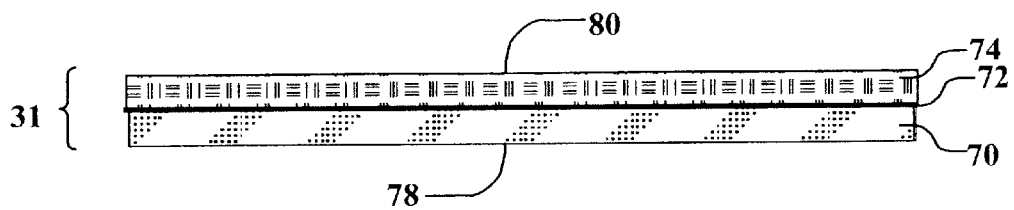
FIG. 6b is a cross-sectional representation of the structure of the donor element coated with one layer of coated material.

Turning now to FIG. 6b, we see one example of a cross-sectional representation of the structure of a donor element coated with one layer of coated material. Donor element 31 includes flexible support 70, which comprises non-transfer surface 78. Flexible support 70 has been uniformly coated with radiation-to-heat conversion layer 72. Radiation-to-heat conversion layer 72 includes material capable of absorbing radiation at the wavelength of interest and emitting heat. Flexible support 70 has been further uniformly coated with coated material 74. Coated material 74 includes coated side 80 of donor element 31.

Figure 6C:
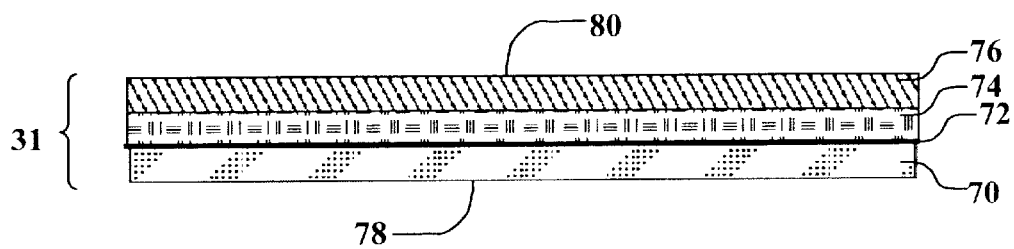
FIG. 6c is a cross-sectional representation of the structure of the donor element coated with more than one layer of coated material.

Turning now to FIG. 6c, we see one example of a cross-sectional representation of the structure of a donor element coated with more than one layer of coated material. Donor element 31 includes flexible support 70, which comprises non-transfer surface 78. Flexible support 70 has been uniformly coated with radiation-to-heat conversion layer 72. Radiation-to-heat conversion layer 72 includes material capable of absorbing radiation at the wavelength of interest and emitting heat. Flexible support 70 has been further uniformly coated with coated material 74 and coated material 76. Coated material 76 includes coated side 80 of donor element 31.

The invention has been described in detail with particular reference to certain preferred embodiments thereof, but it will be understood that variations and modifications can be effected within the spirit and scope of the invention.

Parts List

| | |
|---|---|
| 10 | controlled-atmosphere coater |
| 10a | coating chamber |
| 10b | transfer chamber |
| 10c | cleaning chamber |
| 12 | controlled-atmosphere source |
| 14 | load lock |
| 16 | load lock |
| 18 | load lock |
| 20 | coating station |
| 22 | solvent-removal station |
| 24 | transfer station |
| 26 | cleaning station |
| 27 | coating station |
| 28 | solvent-removal station |
| 30 | donor support element |
| 31 | donor element |
| 32 | donor support |
| 34 | coating apparatus |
| 36 | transfer apparatus |
| 38 | laser |
| 40 | laser beam |
| 42 | receiver element |
| 44 | pressure chamber |
| 46 | transparent portion |
| 48 | gravure coater |
| 50 | heater |
| 51 | flash lamp |
| 52 | vapor remover |
| 54 | heater |
| 56 | vapor remover |

-continued

| 58 | vacuum pump |
| 60 | moveable web |
| 62 | wheel |
| 64 | direction of travel |
| 66 | load lock |
| 68 | load lock |
| 70 | flexible support |
| 72 | radiation-to-heat conversion layer |
| 74 | coated material |
| 76 | coated material |
| 78 | non-transfer surface |
| 80 | coated side |

What is claimed is:

1. An in-situ method for fabricating, at least in part, an OLED device that is moisture- or oxygen-sensitive, such method comprising the steps of:
   a) providing into a controlled-atmosphere coater a receiver element which will form part of the OLED device;
   b) providing into the controlled-atmosphere coater a donor support element and coating such donor support element to produce a donor element with one or more layers required to produce all or part of the OLED device;
   c) controlling the atmosphere in the controlled-atmosphere coater so that either the water vapor level is less than 1000 ppm but greater than 0 ppm or the oxygen level is less than 1000 ppm but greater than 0 ppm, or both the water vapor level and oxygen level are respectively less than 1000 ppm but greater than 0 ppm;
   d) positioning in the controlled-atmosphere coater the coated side of the donor element in material transferring relationship to the receiver element to be coated; and
   e) applying radiation in the controlled-atmosphere coater to the donor element to selectively transfer one or more layers from the donor element to the receiver element while providing a total pressure in the controlled-atmosphere coater greater than 1 Torr.

2. The method of claim 1 further including the step of:
   f) coating by the controlled atmosphere coater the receiver element with one or more layers which forms part of the OLED device.

3. The method of claim 1 further including the step of:
   f) repeating steps b) to e) to produce all or part of the moisture- or oxygen- or moisture and oxygen-sensitive device.

4. The method of claim 1 further including coating the receiver element with a desired number of coated layers.

5. The method of claim 1 further including the step of:
   f) cleaning the donor element to permit it to be recoated.

6. The method of claim 1 further including the step of providing the donor element as part of a moveable web which moves into the material transferring relationship with the receiver element.

7. The method of claim 6 further including the step of cleaning the donor element to permit it to be recoated.

8. An in-situ method useful in fabricating a full color display formed of a number of OLED devices, such display being moisture- or oxygen- or moisture-oxygen sensitive, such method comprising the steps of:
   a) providing into a controlled-atmosphere coater a receiver element which will form part of the display;
   b) providing into the controlled-atmosphere coater a plurality of the donor support elements and coating such donor support elements with materials and wherein each of the donor support elements has at least one different material for providing a different output color from a corresponding OLED device;
   c) controlling the atmosphere in the controlled-atmosphere coater so that either the water vapor level is less than 1000 ppm but greater 0 ppm or the oxygen level is less than 1000 ppm but greater than 0 ppm, or both the water vapor level and oxygen level are respectively less than 1000 ppm but greater than 0 ppm;
   d) sequentially positioning in the controlled-atmosphere coater the coated side of each of the donor elements in material transferring relationship to the receiver element to be coated; and
   e) sequentially applying radiation in the controlled-atmosphere coater to the donor elements to selectively transfer one or more layers from each of the donor elements to corresponding OLED devices formed in the receiver element while providing a total pressure in the controlled-atmosphere coater greater than 1 Torr.

9. The method of claim 8 further including the step of:
   f) coating by the controlled atmosphere coater the receiver element with one or more layers which forms part of OLED devices.

10. The method of claim 8 further including the step of:
    f) repeating steps b) to e) to produce all or part of the moisture- or oxygen- or moisture and oxygen-sensitive device.

11. The method of claim 8 further including coating the receiver element with a desired number of coated layers.

12. The method of claim 8 further including the step of:
    f) cleaning the donor elements to permit them to be recoated.

13. The method of claim 8 further including the step of providing each of the donor elements as part of a moveable web which moves into the material transferring relationship with the receiver element.

14. The method of claim 13 further including the step of cleaning the donor elements to permit them to be recoated.

15. A method for fabricating, at least in part, an OLED device that includes multiple layers some or all of which are moisture- or oxygen-sensitive, such method comprising the steps of:
    a) providing a controlled-atmosphere coater and a vacuum coater and a receiver element which will form part of the OLED device;
    b) providing into the controlled-atmosphere coater a donor support element and coating such donor support element to produce a donor element with one or more layers required to produce all or part of the OLED device and while during coating having a total pressure in the controlled-atmosphere coater greater than 1 Torr;
    c) controlling the atmosphere in the controlled-atmosphere coater so that either the water vapor level is less than 1000 ppm but greater 0 ppm or the oxygen level is less than 1000 ppm but greater than 0 ppm or both the water vapor level and oxygen level are respectively less than 1000 ppm but greater than 0 ppm;
    d) moving the donor element from the controlled-atmosphere coater into the vacuum coater without exposing the donor element to a water vapor level greater than 1000 ppm, or an oxygen level greater than 1000 ppm, or both;
    e) providing in the vacuum coater the donor element and the receiver element in transfer relationship; and
    f) applying radiation in the vacuum coater to the donor element to selectively transfer one or more layers from the donor element to the receiver element.

16. A method for fabricating, at least in part, an OLED device that includes multiple layers some or all of which are moisture- or oxygen-sensitive, such method comprising the steps of:

a) providing a controlled-atmosphere coater and a vacuum coater and a receiver element which will form part of the OLED device;

b) providing into the vacuum coater a donor support element and coating such donor support element to produce a donor element with one or more layers required to produce all or part of the OLED device;

c) moving the donor element from the vacuum coater into the controlled-atmosphere coater without exposing the donor element to a water vapor level greater than 1000 ppm, or an oxygen level greater than 1000 ppm, or both;

d) providing in the controlled-atmosphere coater the donor element and the receiver element in transfer relationship; and e) controlling the atmosphere in the controlled-atmosphere coater so that either the water vapor level is less than 1000 ppm but greater 0 ppm or the oxygen level is less than 1000 ppm but greater than 0 ppm or both the water vapor level and oxygen level are respectively less than 1000 ppm but greater than 0 ppm; and f) applying radiation in the controlled-atmosphere coater to the donor element to selectively transfer one or more layers from the donor element to the receiver element while providing a total pressure in the controlled-atmosphere coater greater than 1 Torr.

* * * * *